United States Patent
Shackleton et al.

(10) Patent No.: US 12,027,373 B2
(45) Date of Patent: Jul. 2, 2024

(54) PLANARIZATION PROCESS, PLANARIZATION SYSTEM, AND METHOD OF MANUFACTURING AN ARTICLE

(71) Applicant: CANON KABUSHIKI KAISHA, Tokyo (JP)

(72) Inventors: Steven C. Shackleton, Austin, TX (US); Seth J. Bamesberger, Austin, TX (US); Xiaoming Lu, Cedar Park, TX (US); Byung-Jin Choi, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 400 days.

(21) Appl. No.: 17/334,075

(22) Filed: May 28, 2021

(65) Prior Publication Data
US 2022/0384205 A1     Dec. 1, 2022

(51) Int. Cl.
*H01L 21/3105*     (2006.01)
*B05D 3/06*     (2006.01)
*H01L 21/67*     (2006.01)

(52) U.S. Cl.
CPC ........ *H01L 21/31051* (2013.01); *B05D 3/067* (2013.01); *H01L 21/6715* (2013.01)

(58) Field of Classification Search
CPC .................................................. B05D 3/067
See application file for complete search history.

(56) References Cited

U.S. PATENT DOCUMENTS

| | | |
|---|---|---|
| 8,084,185 B2 | 12/2011 | Burns et al. |
| 8,237,133 B2 | 8/2012 | Ganapathisubramanian et al. |
| 8,973,495 B2 | 3/2015 | Kasumi et al. |
| 2020/0307036 A1 | 10/2020 | Iwatani |
| 2022/0102167 A1* | 3/2022 | Shackleton ....... H01L 21/67092 |

FOREIGN PATENT DOCUMENTS

TW     202109735 A     3/2021

\* cited by examiner

*Primary Examiner* — Dah-Wei D. Yuan
*Assistant Examiner* — Kristen A Dagenais
(74) *Attorney, Agent, or Firm* — CANON U.S.A., INC. IP Division

(57) ABSTRACT

A method of planarizing a substrate comprises dispensing formable material onto a substrate, contacting a superstrate held by a superstrate chuck with the formable material on the substrate, thereby forming a multilayer structure including the superstrate, a film of the formable material, and the substrate, releasing the multilayer structure from the superstrate chuck, providing a space between the superstrate chuck and the multilayer structure after the releasing, positioning a light source into the provided space between the superstrate chuck and the multilayer structure, and curing the film of the multilayer structure by exposing the film to light emitted from the light source.

18 Claims, 18 Drawing Sheets

PLANARIZATION PROCESS, PLANARIZATION SYSTEM, AND METHOD OF MANUFACTURING AN ARTICLE

BACKGROUND

Field of Art

The present disclosure relates to substrate processing, and more particularly, to planarization of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

In certain known planarization systems and methods, a curing step is performed by transmitting UV light radiation through a transparent superstrate chuck. Curing through the transparent superstrate chuck can result in non-uniform transmission of UV light radiation to formable material located at the edges of the substrate because of the structure of the superstrate chuck. In particular, the transparent superstrate chuck comprises geometric features such as recesses, lands and channels that cause non-uniform transmission of the UV light passing through. Furthermore, high intensity peaks may occur at sharp edges of the superstrate chuck due to Fresnel diffraction at the edges of the geometric features, which can affect the uniformity. The non-uniformity transmission can lead to unsatisfactory curing performance. Thus, there is a need in the art for a planarization system and method that prevent these disadvantages.

SUMMARY

A method of planarizing a substrate comprises dispensing formable material onto a substrate, contacting a superstrate held by a superstrate chuck with the formable material on the substrate, thereby forming a multilayer structure including the superstrate, a film of the formable material, and the substrate, releasing the multilayer structure from the superstrate chuck, providing a space between the superstrate chuck and the multilayer structure after the releasing, positioning a light source into the provided space between the superstrate chuck and the multilayer structure, and curing the film of the multilayer structure by exposing the film to light emitted from the light source.

A planarization system comprises a substrate chuck configured to hold a substrate, a superstrate chuck configured to hold a superstrate, a first positioning system configured to: cause the superstrate to come into contact with formable material dispensed on the substrate to form a multilayer structure, the multilayer structure including the superstrate, a film of the formable material, and the substrate, and after the multilayer structure is released from the superstrate chuck, provide a space between the superstrate chuck and the multilayer structure, a light source, and a second positioning system configured to move the light source into the provided space between the superstrate chuck and the multilayer structure.

A method of manufacturing an article comprises dispensing formable material onto a substrate, contacting a superstrate held by a superstrate chuck with the formable material on the substrate, thereby forming a multilayer structure including the superstrate, a film of the formable material, and the substrate, releasing the multilayer structure from the superstrate chuck, providing a space between the superstrate chuck and the multilayer structure after the releasing, positioning a light source into the provided space between the superstrate chuck and the multilayer structure, curing the film of the multilayer structure by exposing the film to light emitted from the light source, and processing the cured film to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
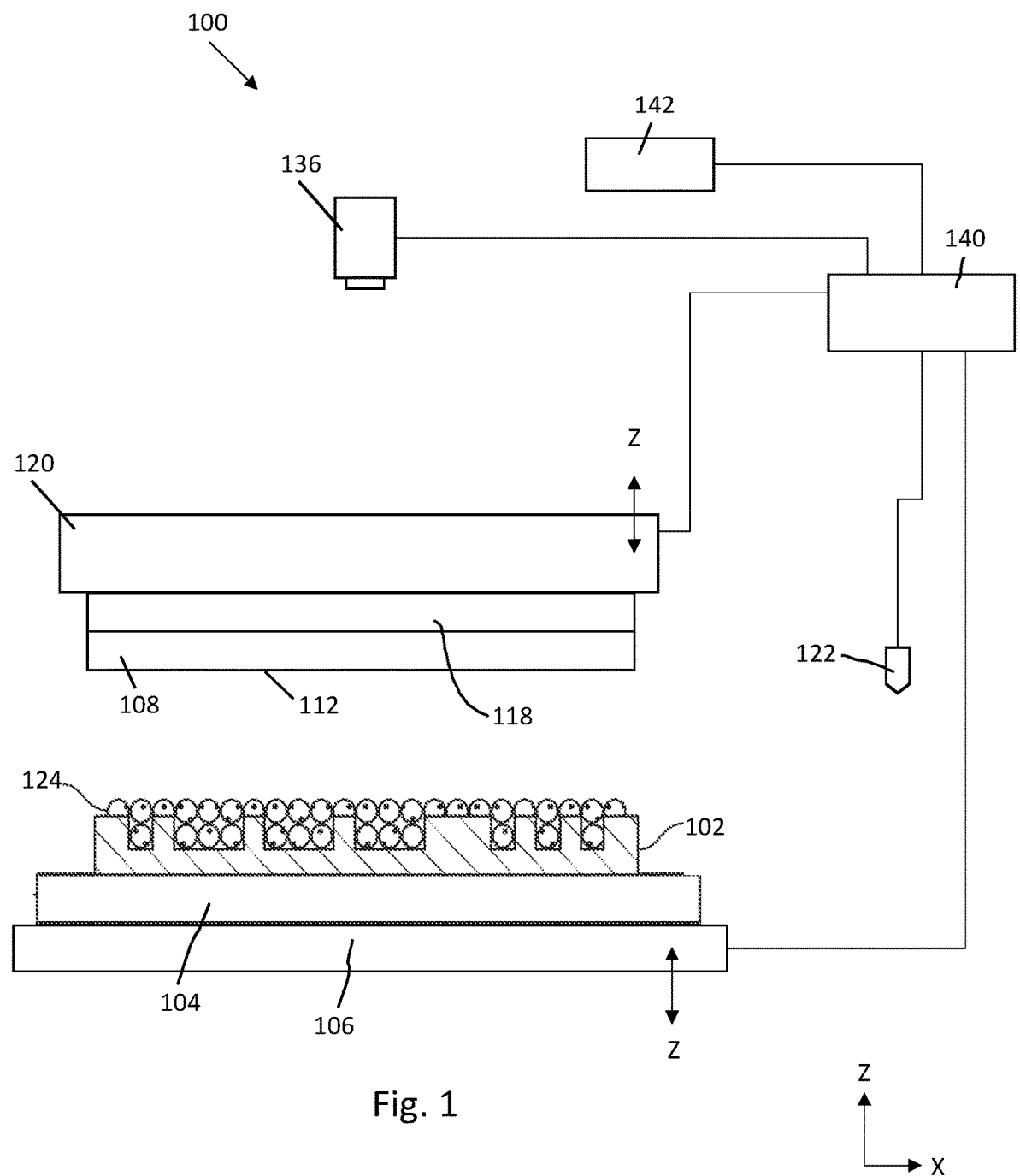
FIG. 1 is a schematic cross section of an example planarization system in accordance with an aspect of the present disclosure.

FIG. 1 illustrates an example planarization system 100 in accordance with an aspect of the present disclosure. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the cartesian x-, y-, z-axes; and three tilt axes. The substrate positioning stage 106, the substrate 102, and the substrate chuck 104 may also be positioned on a base (not shown). The movement of the stage 106 may be controlled by a controller 140, discussed below. The combination of the features that provide for the relative movement and the controller for controlling the movement of the substrate is referred herein as a first positioning system.

The planarization system 100 may comprise a fluid dispenser 122. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

As shown in FIG. 1, the planarization system 100 may comprise a superstrate 108 having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is transparent to UV light radiation. The surface 112 is generally of the same areal size as or slightly larger than the surface of the substrate 102.

The planarization system 100 may further include a superstrate chuck 118 and a planarization head 120. The superstrate 108 may be coupled to or retained by the superstrate chuck 118. As noted above, the superstrate chuck 118 may include geometric features such as recesses, lands, and channels that cause non-uniform transmission if UV light passes through it, especially when the recesses, lands, and channels are close to the focal plane of the UV light radiation. In an embodiment, the superstrate chuck 118 need not be transparent to UV light because, as discussed below, UV light is not emitted through the superstrate chuck 118 as part of a curing process. That is, in an embodiment, the superstrate chuck 118 may be semi-transparent or opaque to UV light. Because UV light is not transmitted through the superstrate chuck 118, the non-uniform transmission of UV light is avoided. However, the superstrate chuck 118 may still be transparent to UV light in another embodiment.

The superstrate chuck 118 may be coupled to the planarization head 120. The planarization head 120 may be movably coupled to a bridge (not shown). The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, and three tilt axes). The aspects of the planarization head that allow for this movement, as controlled by the controller 140, are also components of the first positioning system. In operation, either the planarization head 120, the substrate positioning stage 106, or both vary a distance between the superstrate 108 and the substrate 102 to define a desired space (a bounded physical extent in three dimensions) that is filled with the formable material 124. For example, the planarization head 120 may be moved toward the substrate and may apply a force to the superstrate 108 such that the superstrate contacts and spreads droplets of the formable material 124 as further detailed herein. The same effect may also be achieved by moving the substrate 102 toward the superstrate 108, or both can be moved together.

The planarization system 100 may further comprise a camera 136 positioned to view the spread of formable material 124 as the superstrate 108 contacts the formable material 124 during the planarizing process. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The fluid dispenser 122 may be movably coupled to the bridge. In an embodiment, the fluid dispenser 122 and the planarization head 120 share one or more or all positioning components. The positioning components are part of the first positioning system. In an alternative embodiment, the fluid dispenser 122 and the planarization head 120 move independently from each other. The fluid dispenser 122 and the planarization head 120 are moveable so that each can perform their respective functions without interfering with each other.

Figure 2:
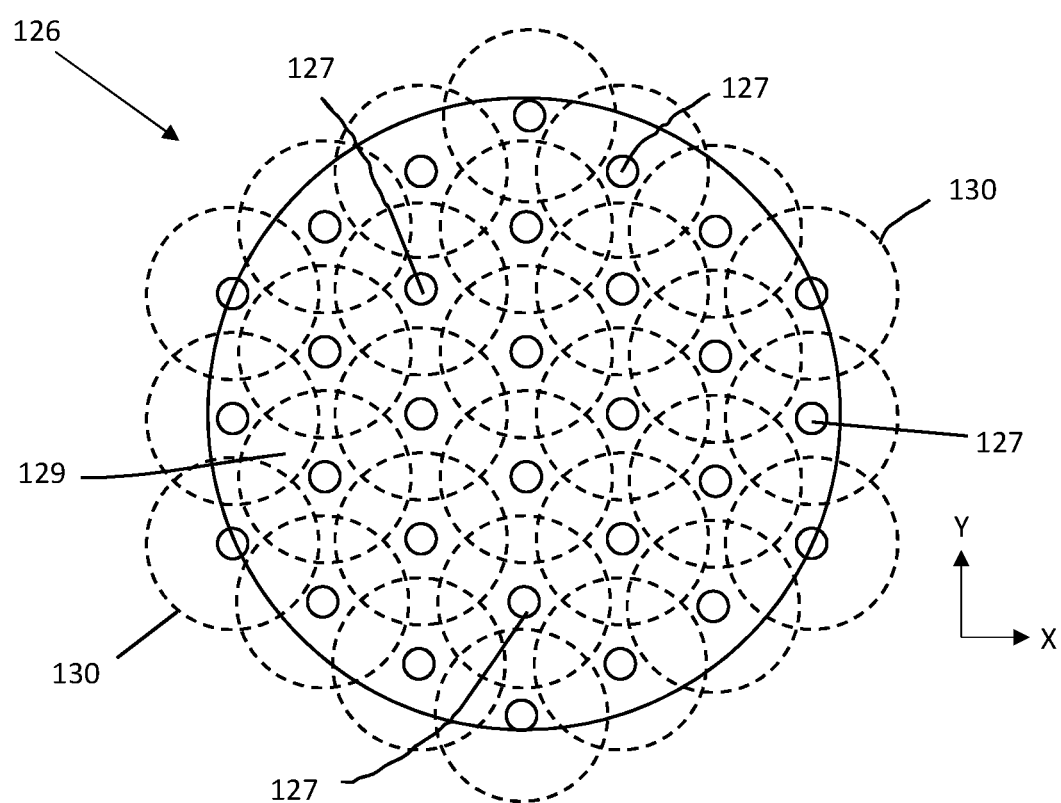
FIG. 2 is a schematic plan view of an example radiation source including an array of light emitting diodes in accordance with an aspect of the present disclosure.
Figure 4A:
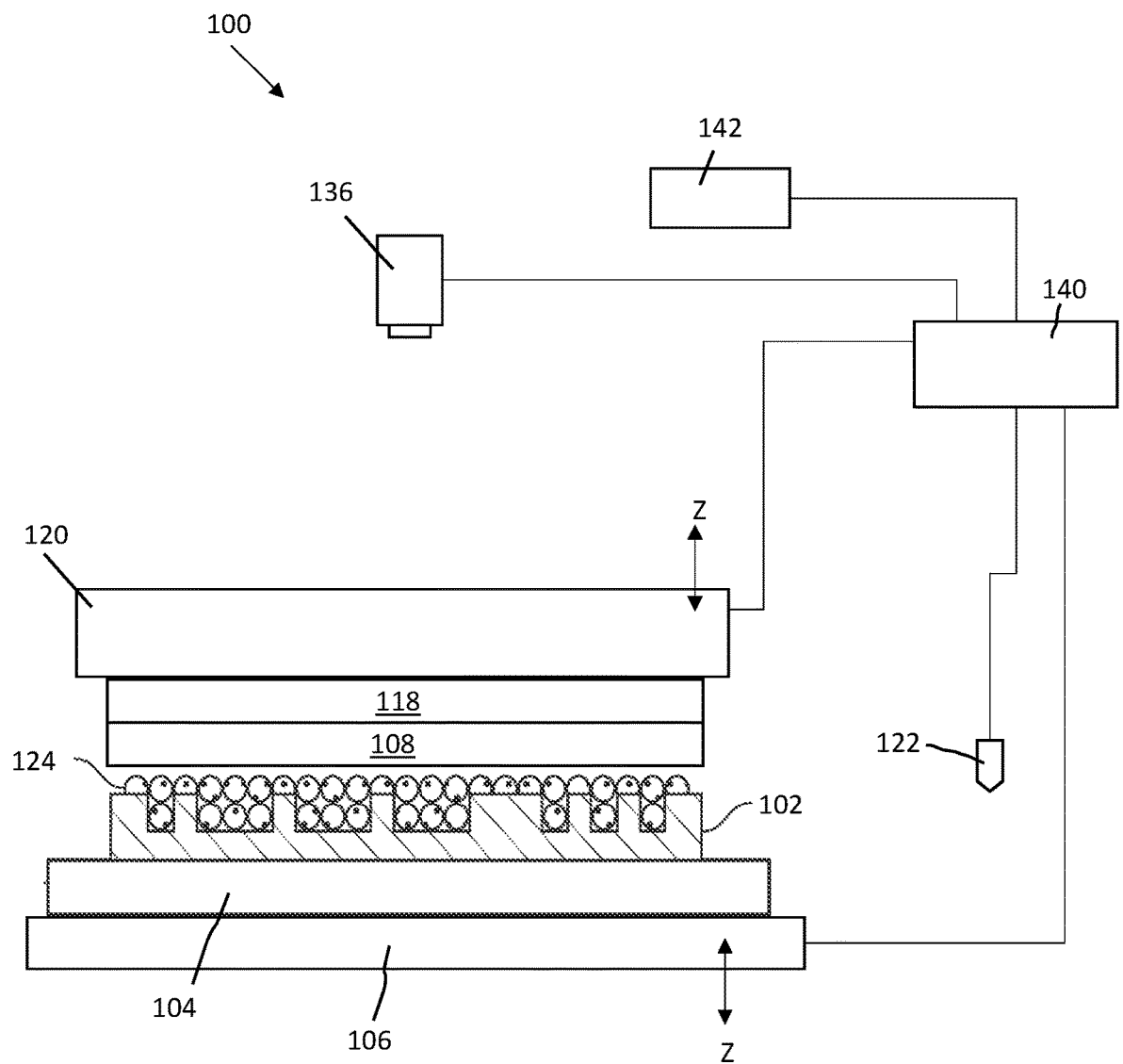
FIGS. 4A to 4J show schematic cross sections of the operation of the planarization system when performing the method of FIG. 3.
Figure 4B:
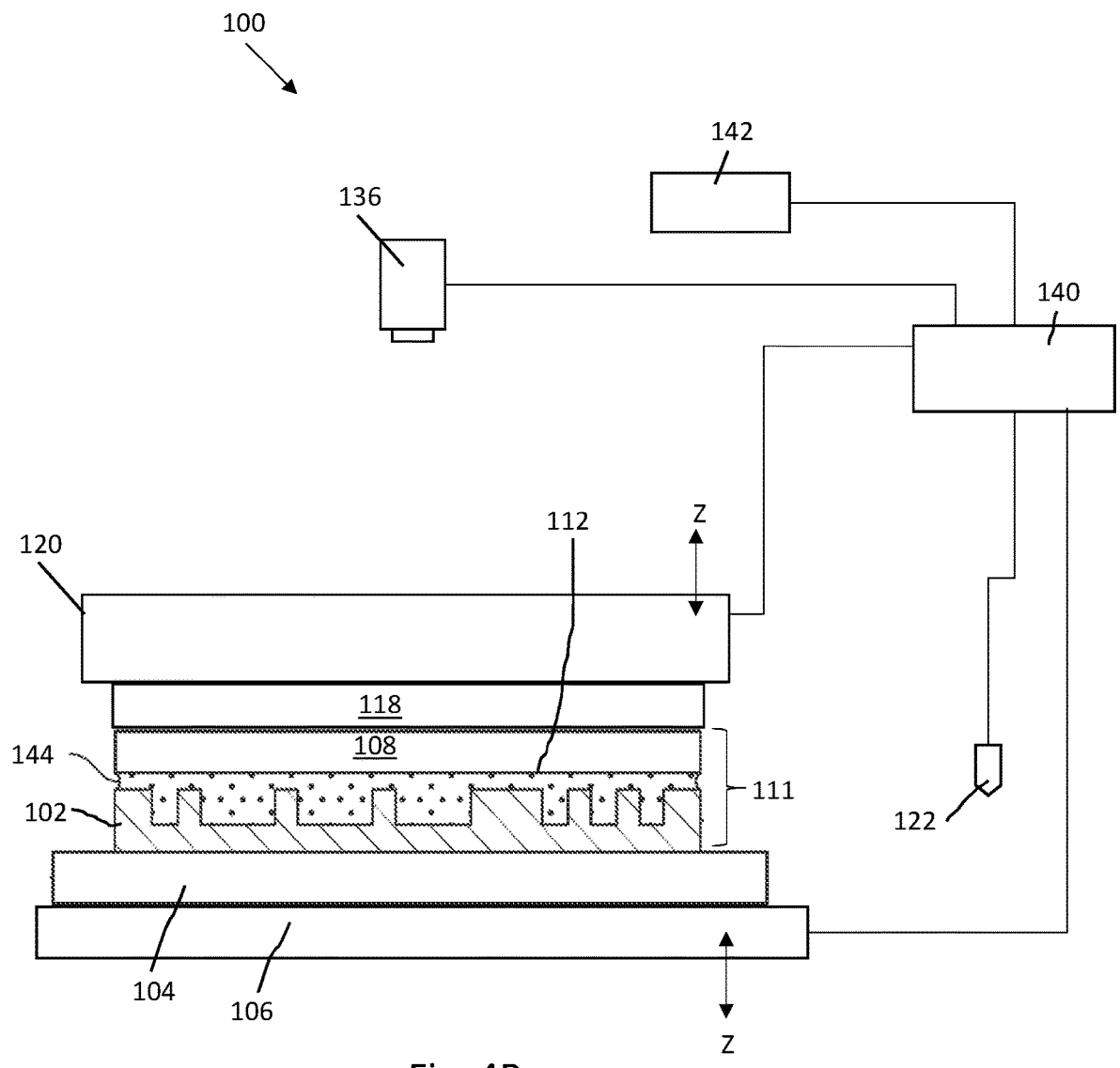
Figure 4C:
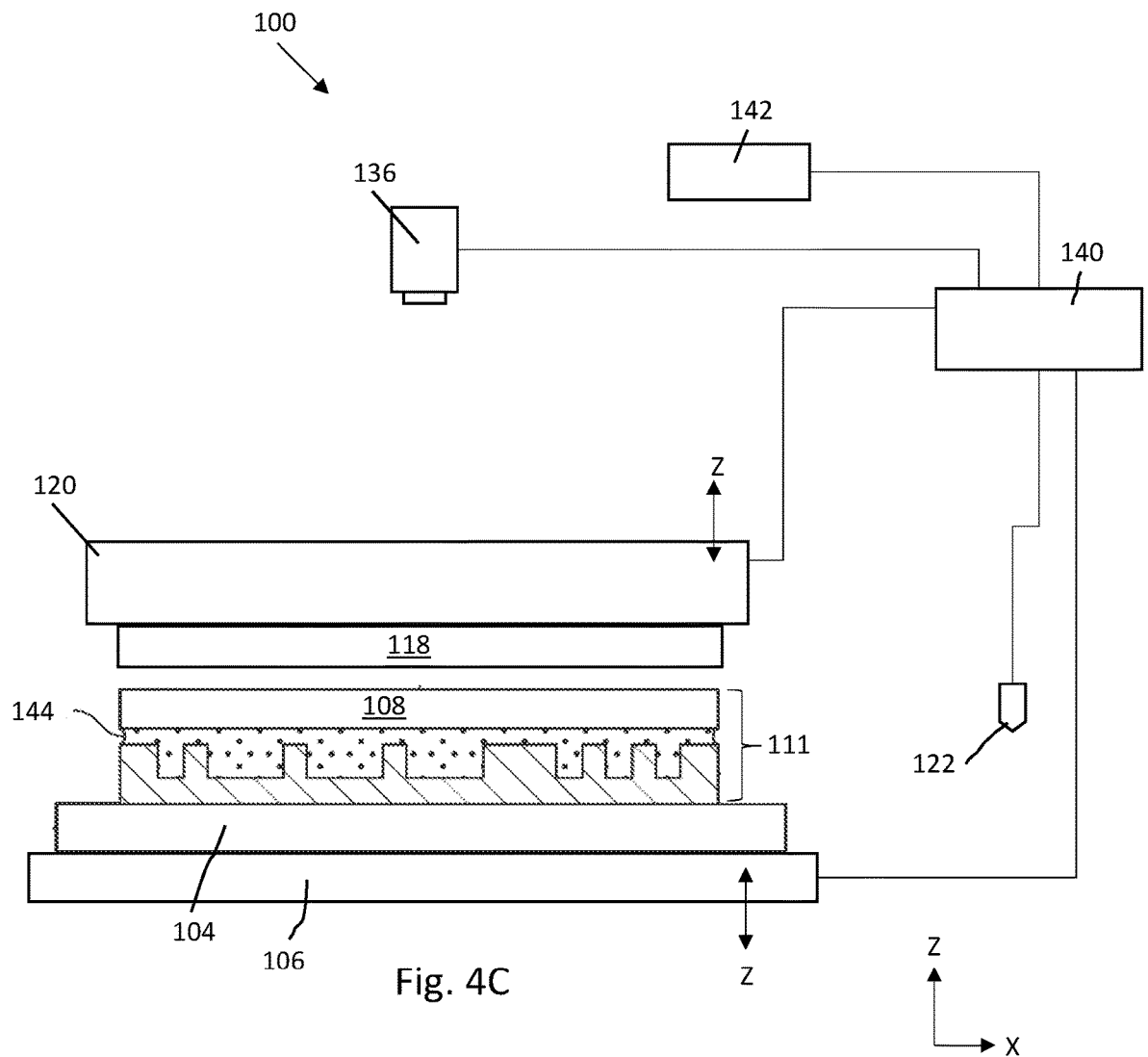
Figure 4D:
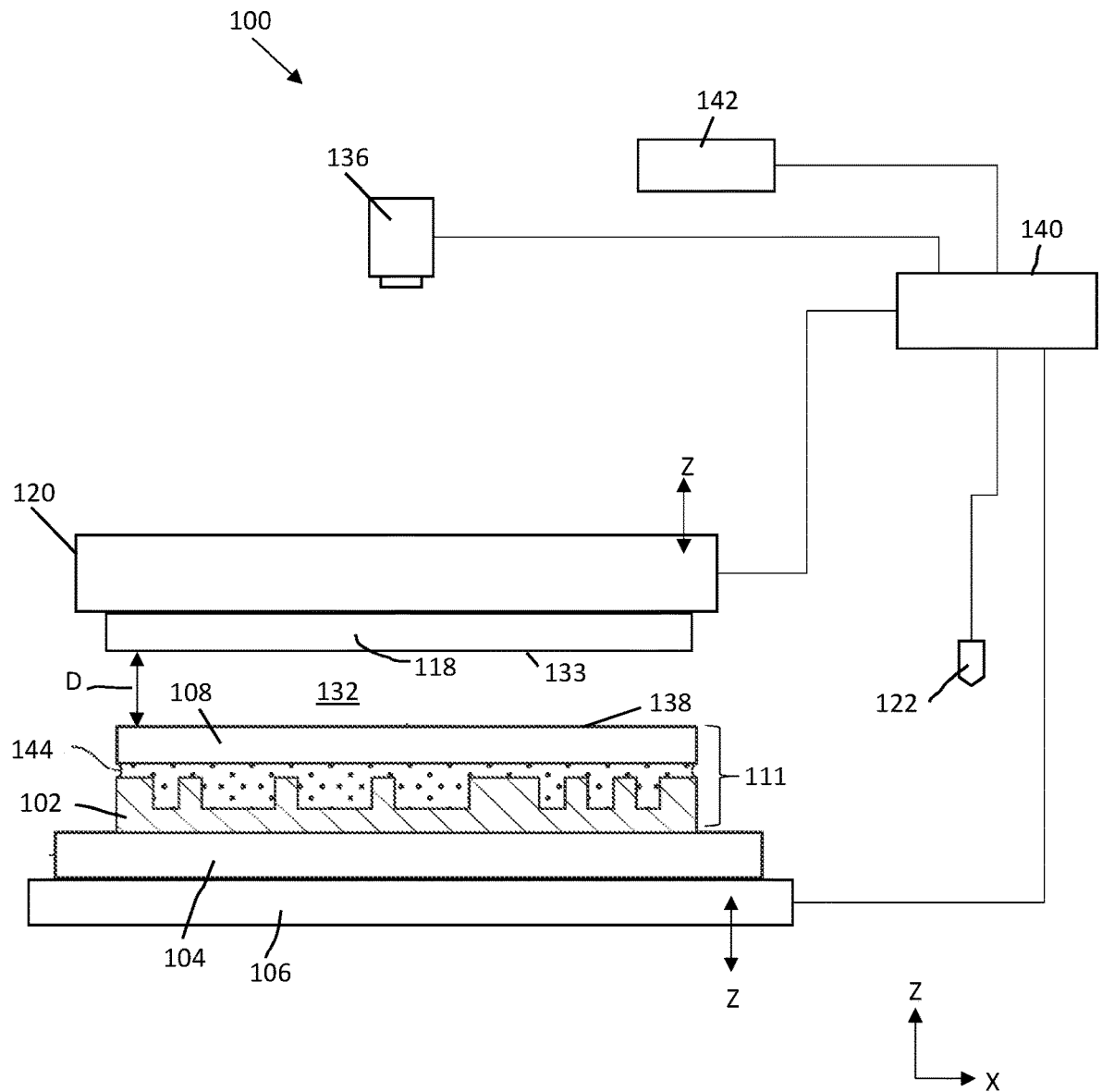
Figure 4E:
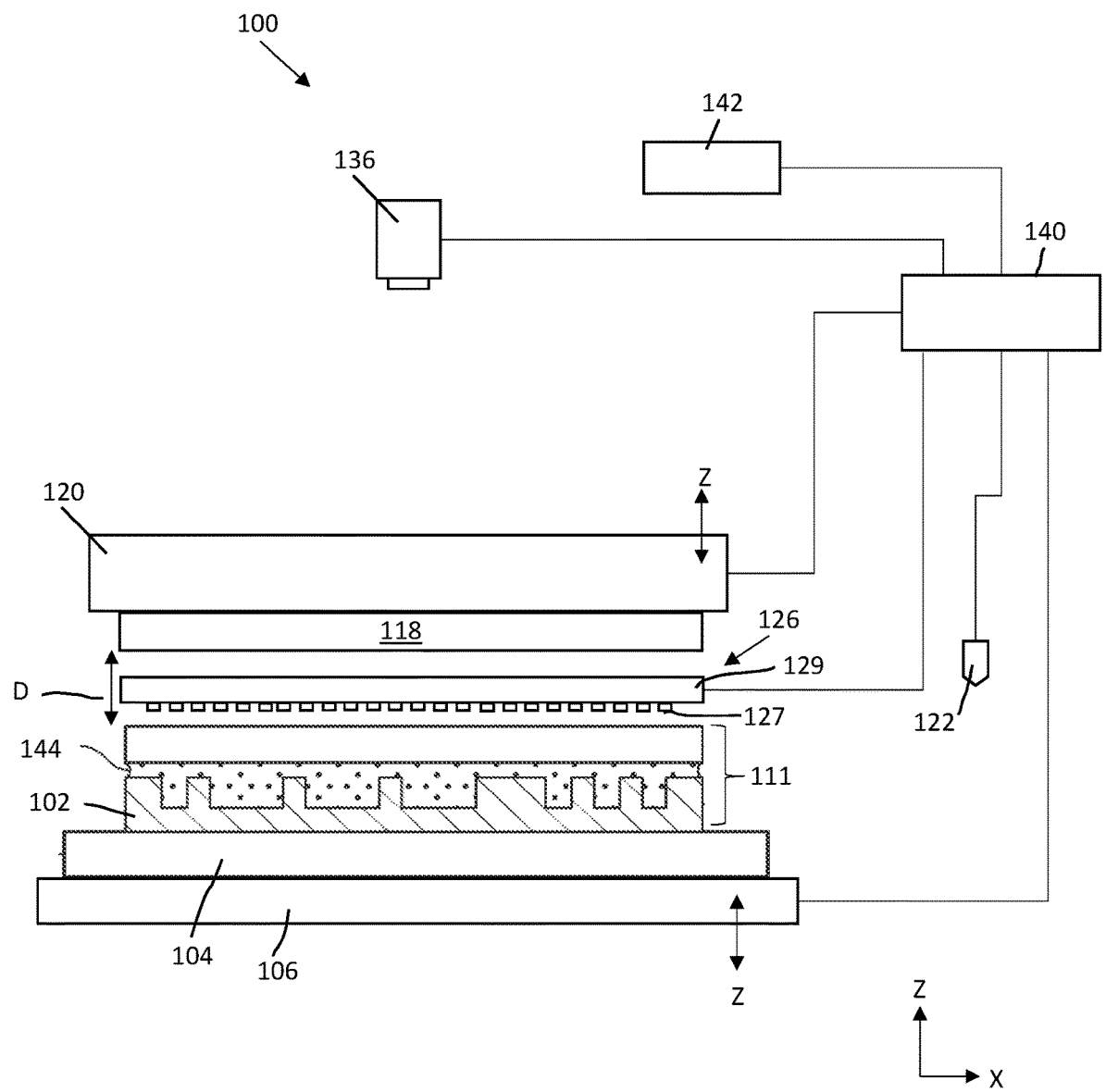
Figure 4F:
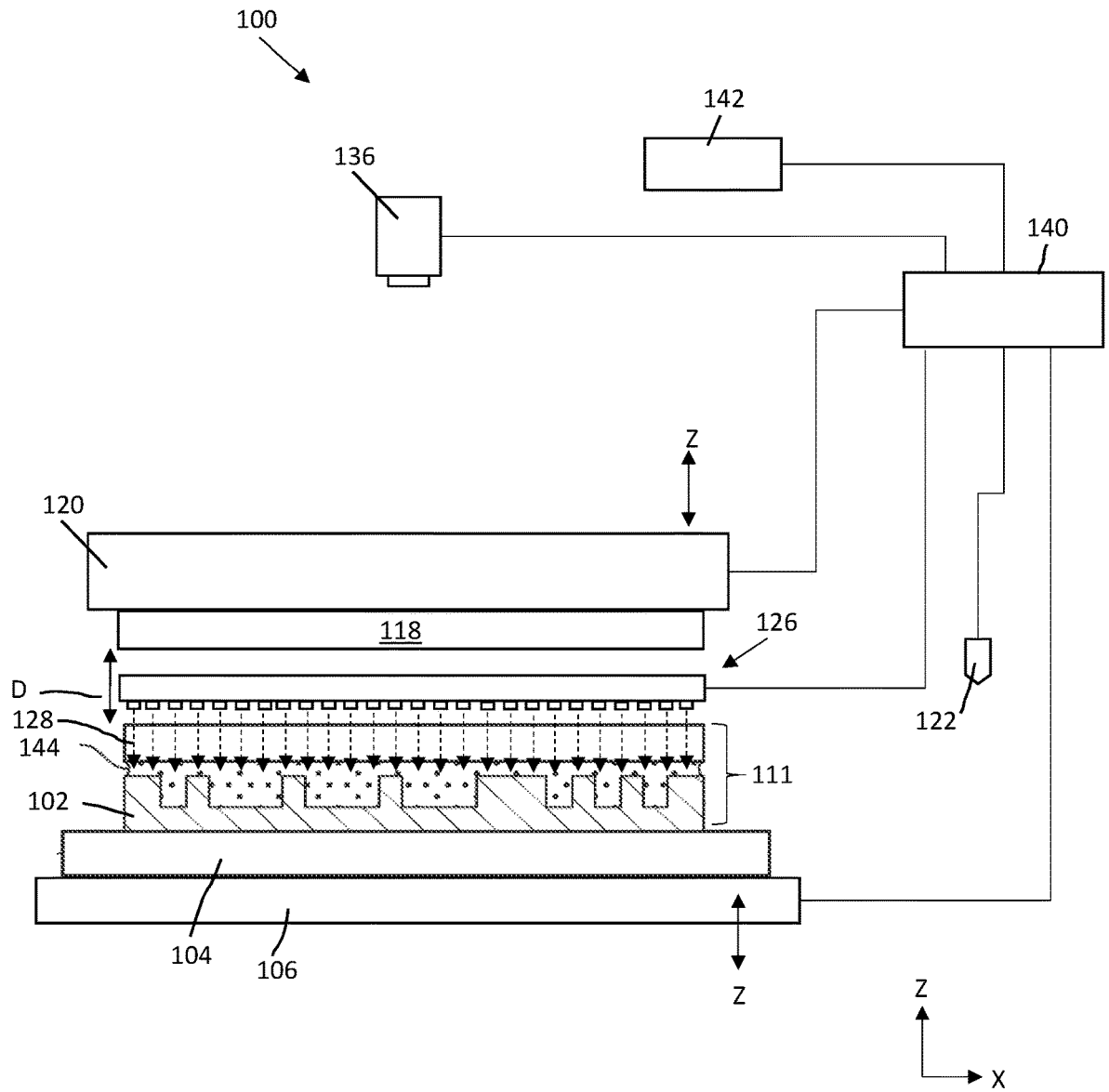

The planarization system 100 may include a radiation source 126 (FIGS. 2, 4E-4G, and 6-9B) that directs actinic energy, for example, UV light radiation, along an exposure path 128 (FIG. 4F). In one example embodiment the radiation source 126 comprises an array of light emitting diodes (LEDs) 127 mounted on a support 129. FIG. 2 shows a schematic plan view of an example radiation source 126 including an array of light emitting diodes 127 on a support 129. As shown in FIG. 2, the LEDs 127 may be arranged linearly on the support 129. In an embodiment, the support 129 may have a circular shape and be the same size or slightly larger than the substrate 102 (e.g., FIGS. 5-7). In another embodiment, the radiation source 126 may comprise two semicircle halves, referred herein as a first body 126a and a second body 126b, that together form the radiation source 126 that is the same size or slightly larger than the substrate 102 (e.g., FIGS. 8A-9B). FIG. 2 further shows an area of light coverage 130 for each of the LEDS 127. The radiation source 126 may also include a diffuser (not shown). The diffuser may be positioned proximate the light output of the LEDs to assist in achieving a target uniformity. The wavelength of the light emitted may be 300 to 400 nm. In an alternative embodiment, one or more sensors of the camera 136 may be integrated with the LEDS 127 of the radiation source 126. In another alternative embodiment, an optical combiner (not shown) may be used to direct light from the radiation source 126 through the superstrate 108 while allowing light from the substrate 102 to be gathered by the camera 136.

The radiation source 126 may be inserted into a space between the superstrate chuck 118 and the superstrate 108, which is discussed below. Such an arrangement reduces the overall space required by the planarization system 100 (by avoiding external optical elements) and also avoids the need to transmit light through the superstrate chuck 118. Furthermore, for the array of LEDs 127 to be most effective, the array of LEDs 127 should be close to the surface of the formable material 124 being cured. The array of LEDs 127 of the radiation source 126 may be directed downwardly (FIG. 4F), i.e., in the Z direction. More particularly, the center of the beam emitted by each of the LEDs 127 travels in a vertical line parallel to the Z direction.

The planarization system 100 may be regulated, controlled, and/or directed by one or more processors 140 (controller) in communication with one or more components and/or subsystems such as the substrate chuck 104, the substrate positioning stage 106, the superstrate chuck 118, the fluid dispenser 122, the planarization head 120, the camera 136, the radiation source 126, and positioning systems. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140. The features that provide for movement and control of the movement for the various components of the system are the positioning systems.

Planarization Method

Figure 3:
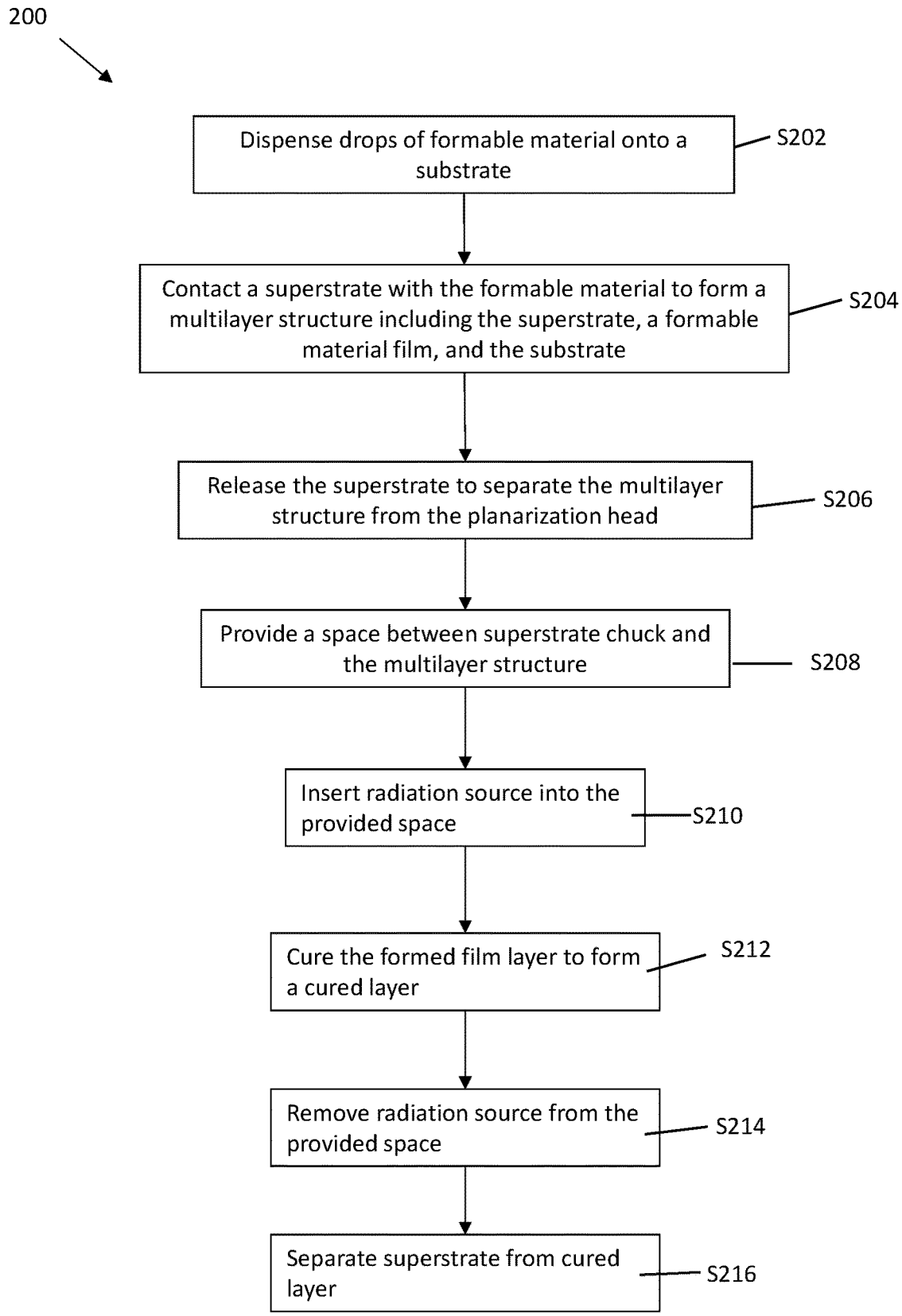
FIG. 3 is a flow chart of a planarization method in accordance with an aspect of the present disclosure.

FIG. 3 shows a flow chart of a planarization method 200 in accordance with an example embodiment. FIGS. 4A to 4J show schematic cross sections of the operation of the planarization system 100 when performing the method 200. The planarization method 200 may begin with step S202, where formable material 124 is dispensed onto the substrate 102 in the form of droplets. As discussed above, the substrate 102 surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The step S202 may be performed using the dispenser 122 either at the same location as the planarizing head 120 or at another location by carrying the substrate 102 to a dispensing location. FIG. 1 shows the substrate 102 after the formable material has been dispensed. FIG. 4A shows a schematic cross section of the substrate 102 just before the superstrate 108 comes into contact with formable material 124, i.e., after the completion of step S202 and just before step S204. That is, at the moment shown in FIG. 4A, the superstrate 108 is being held by the superstrate chuck 118 and has not yet come into contact with the formable material 124. In order to reach the position shown in FIG. 4A, at least one of the planarization head 120 and the stage 106 is moved in the Z direction using the first positioning system such that the distance between the planarization head 120 and the substrate 102 with formable material 124 is reduced. Preferably, only one of the planarization head 120 and stage 106 is moved in the Z direction, while the other is stationary. In a preferred embodiment planarization head 120 moves downwardly in the Z direction while the stage 106 remains stationary. However, in some instances both may be moved.

The planarization method 200 may then proceed to step S204, where the substrate 102 having the formable material 124 is planarized using the planarizing head 120 to form a multilayer structure 111. As noted above, using the first positioning system, the planarization head 120 may be moved toward the substrate 102 to apply a force to the superstrate 108 such that the superstrate 108 contacts and spreads droplets of the formable material 124. FIG. 4B illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. In an embodiment, the substrate 102 and/or the superstrate 108 is supported by a controlled back pressure from the substrate chuck 106 and/or superstrate chuck 118 to make the formable material 124 spread without trapping voids. The spreading starts from the center of the substrate 102 and ends at the boundary of the active area of the substrate 102. At the moment shown in the FIG. 4B, the step S204 has been completed. Furthermore, at this moment, while the superstrate 108 is still in contact with the formable material 124, a multilayer structure 111 has been formed. In particular, the multilayer structure 111 comprises or consists of the superstrate 108, the formable material film 144, and the substrate 102, in that order. In another aspect, the multilayer structure may also be considered to comprise or consist of the superstrate 108, the formable material film 144, the substrate 102, and the substrate chuck 104, in that order. In either case, as shown in FIG. 4B, in the multilayer structure 111, the underside surface 112 of the superstrate 108 is in direct contact with the upper surface of the formable material film 144, while the underside surface of the formable material film 144 is in direct contact with the upper surface of the substrate 102.

The method may then proceed to step S206, where the superstrate 108 is released from the superstrate chuck 118 while the superstrate 108 is still in contact with the formable material film 144. FIG. 4C shows a schematic cross section of the planarization system 100 just after release of the superstrate 108. This action of releasing the superstrate 108 from the superstrate chuck 118 leaves the multilayer structure 111 free from the planarization head 120. The releasing of the superstrate 108 from the superstrate chuck 118 may also be referred to as dechucking. Thus, as a result of releasing the superstrate 108 from the superstrate chuck 118, the multilayer structure 111 (i.e., the superstrate 108, the formable material film 144, and the substrate 102 in that order) remains in contact only with the substrate chuck 106.

The method may then proceed to step S208 where the first positioning system is used to provide a space 132 (FIG. 4D) between the superstrate chuck 118 and the multilayer structure 111. More particularly, the space 132 is provided by creating a distance D between an underside surface 133 of the superstrate chuck 118 and the upper surface 138 of the superstrate 108 in the Z direction. The distance D is selected such that there is just enough space to insert the radiation source 126 in the space 132. The distance D may be 10 mm to 200 mm, preferably 30 mm to 150 mm. A ratio of the distance D to a thickness of the radiation source may be 1.6:1 to 1.4:1 or 2:1 to 1.1:1, preferably 1.5:1

The space 132 may be provided by using the first positioning system to move at least one of the planarization head 120 and the stage 106 in the Z direction until the distance D between superstrate chuck 118 and the multilayer structure 111 is reached. As noted above, preferably, only one of the planarization head 120 and stage 106 is moved in the Z direction, while the other is stationary. In a preferred embodiment planarization head 120 moves upwardly in the Z direction while the stage 106 remains stationary. Thus, once the distance D has been reached, the space 132 has been provided.

The method may then proceed to step S210, where the radiation source 126 is inserted into the provided space 132. FIG. 4E shows a schematic cross section of planarization system 100 at a moment after the radiation source 126 has been inserted into the space 132, while multilayer structure 111 remains at the distance D from the superstrate chuck 118. The radiation source 126 may be inserted into the space 132 through a variety of methods.

Figure 5:
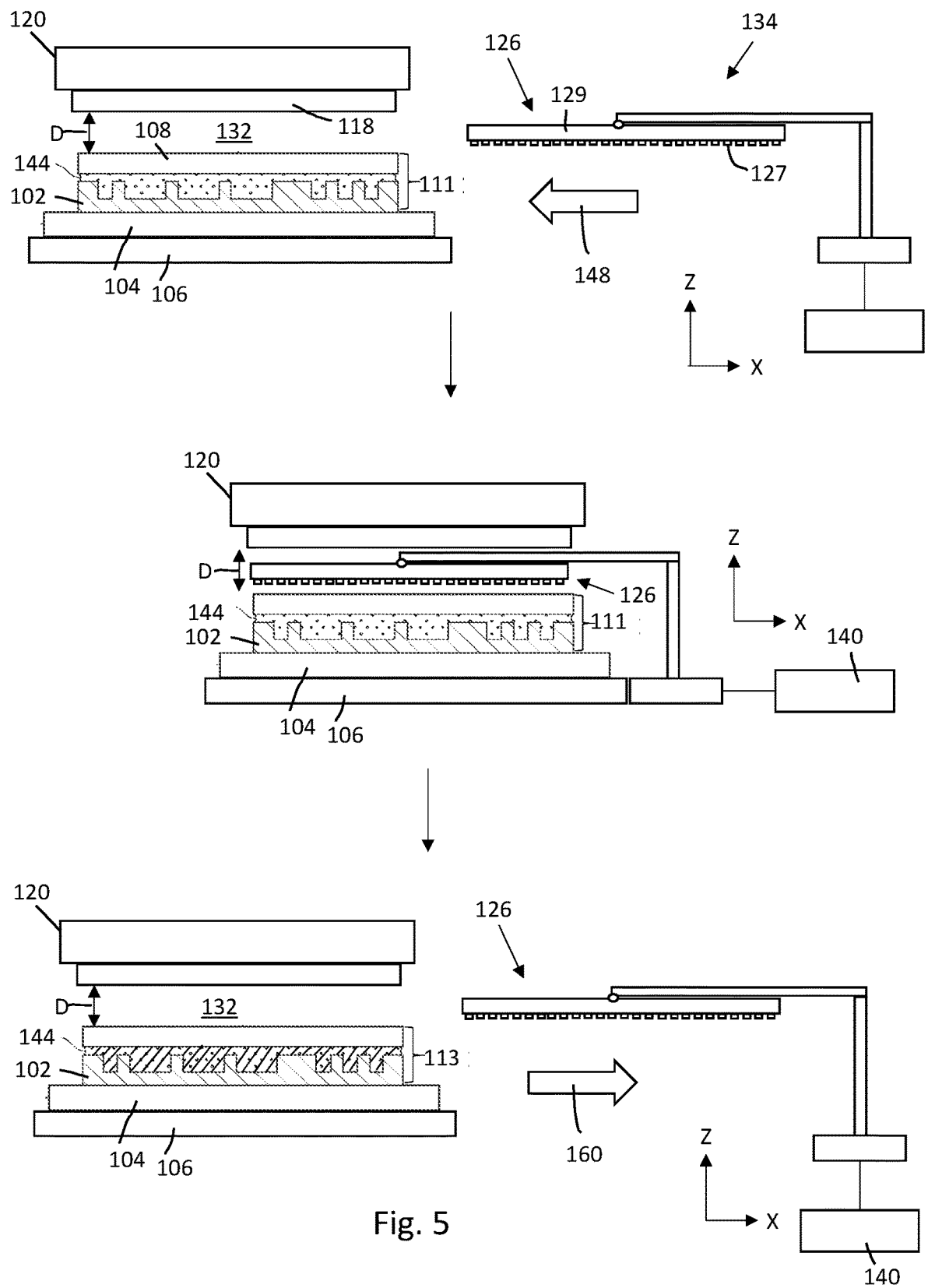
FIG. 5 is a series of schematic cross sections of a first example embodiment for inserting a radiation source in accordance with an aspect of the present disclosure.

FIG. 5 shows a series of schematic cross sections of a first example embodiment for inserting the radiation source 126 into the space 132. In the first example embodiment of FIG. 5, the planarization system 100 includes an arm 134 configured to carry the radiation source 126. In the embodiment shown in FIG. 5, the arm 134 is moveable laterally in the X dimension. As shown in FIG. 5, the insertion process starts with the arm 134 positioned at a location where the radiation 126 is not yet inserted into the space 132. Once step S208 has been completed such that the distance D is created, thereby providing the space 132, the controller 140 may instruct the arm 134 to move in a direction 148 along the X dimension. The arm 134, the controller 140, and all components that allow the arm 134 to move along the X dimension collectively form a second positioning system. That is, the second positioning system is the structure and control that allows positioning of the radiation source 126 into the space 132. As shown in FIG. 5, the arm 134 may be controlled by the controller 140 to continue to move in the direction 148 along the X dimension until the radiation source 126 is positioned completely within the space 132.

Figure 6:
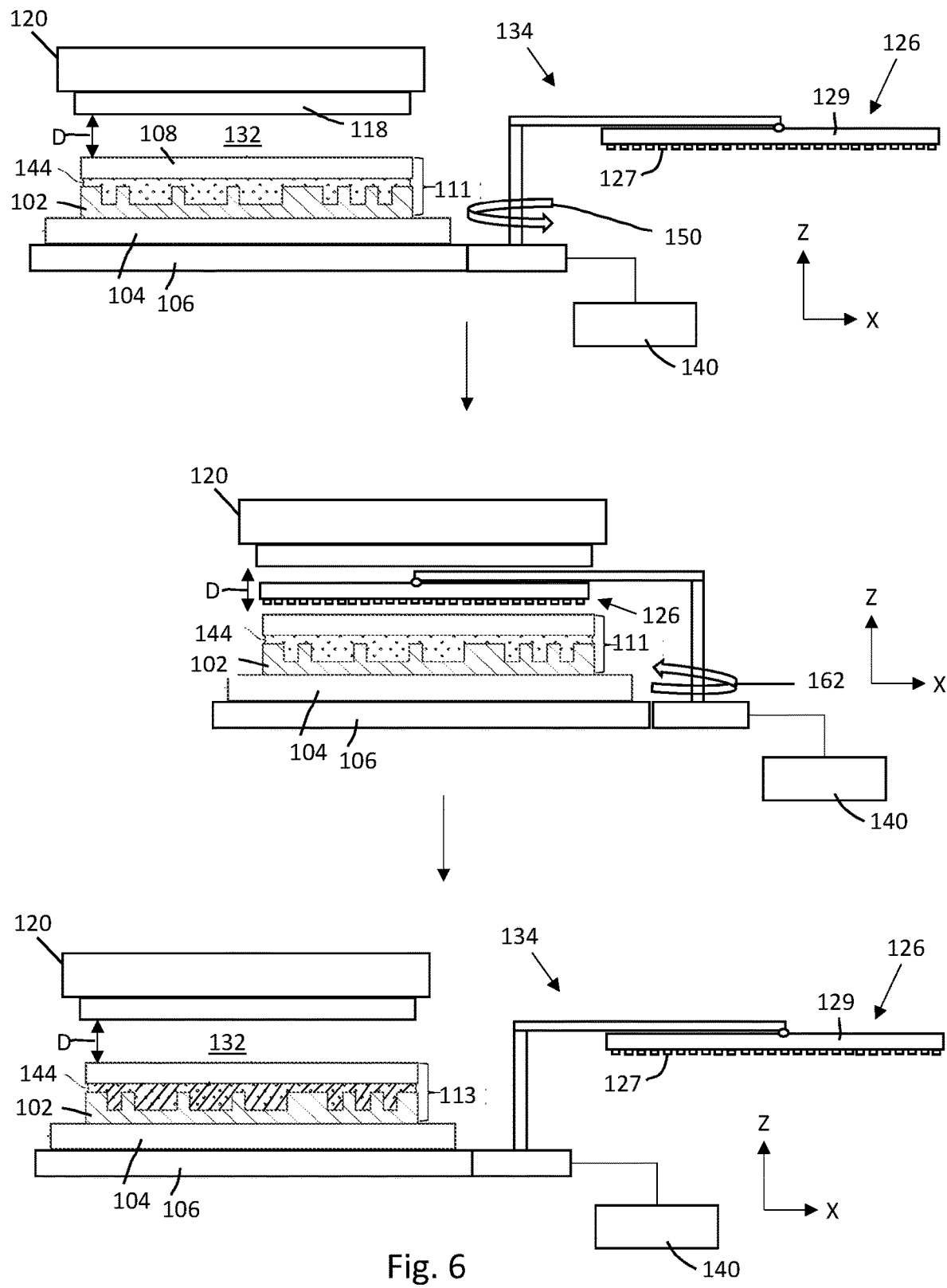
FIG. 6 is a series of schematic cross sections of a second example embodiment for inserting a radiation source in accordance with an aspect of the present disclosure.

FIG. 6 shows a series of schematic cross sections of a second example embodiment for inserting the radiation source 126 into the space 132. In the second example embodiment of FIG. 6, the planarization system 100 includes the same arm 134 as the first embodiment, where the arm 134 similarly carries the radiation source 126. However, in the second embodiment shown in FIG. 6, the arm 134 is rotatable about the Z dimension. As shown in FIG. 6, the insertion process starts with the arm 134 positioned at an orientation where the radiation 126 is not yet inserted into the space 132. Once step S208 has been completed such that the distance D is created, thereby providing the space 132, the controller 140 may instruct the arm 134 to rotate in direction 150 about the Z dimension. The arm 134, the controller 140, and all components that allow the arm 134 to rotate about the Z dimension collectively form the second positioning system. That is, the second positioning system is the structure and control that allow positioning of the radiation source 126 into the space 132 via rotation. As shown in FIG. 6, the arm 134 may be controlled by the controller 140 to continue to rotate in the direction 150 about the Z dimension until the radiation source 126 is located completely within the space 132.

Figure 7:
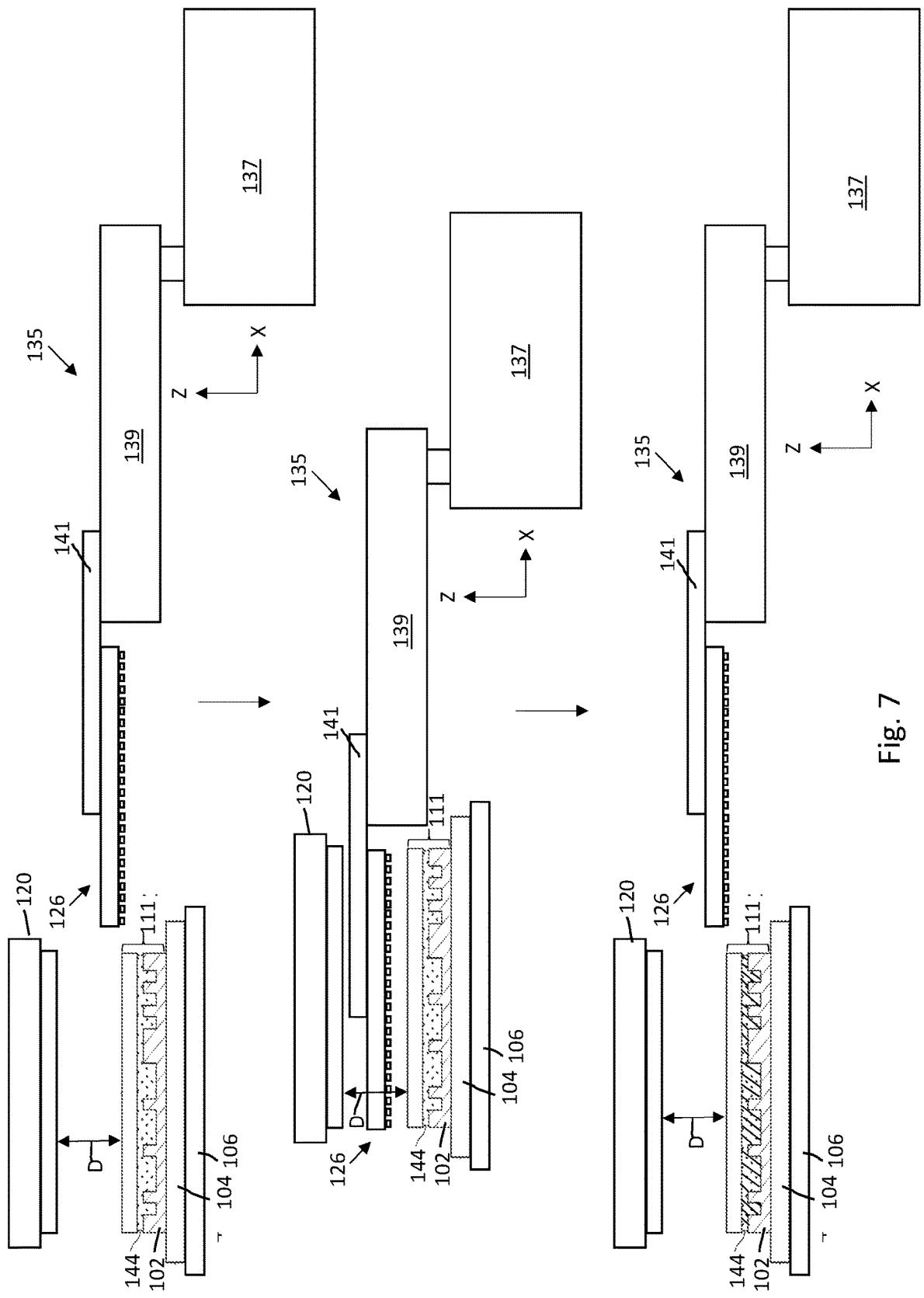
FIG. 7 is a series of schematic cross sections of a third example embodiment for inserting a radiation source in accordance with an aspect of the present disclosure.

FIG. 7 shows a series of schematic cross sections of a third example embodiment for inserting the radiation source 126 into the space 132. In the third example embodiment of FIG. 7, the planarization system 100 uses a substrate robot loading arm 135 to insert the radiations source 126 in the space 132. As shown in FIG. 7, the substrate robot loading arm 135 includes a first articulating arm 137 coupled with a second articulating arm 139. The substrate robot loading arm 135 further includes a hand 141 coupled with the second articulating arm 139. The hand 141 is also known as an end effector. The hand 141 is configured to carry and place the substrate 102 into position on the substrate stage 106 prior to dispensing formable material 124, as part of the planarization process. However, in the third embodiment, the hand 141 is also configured to pick up and carry the radiation source 126. Thus, in the third embodiment, by modifying the substrate robot loading arm 135 such that the hand 141 (end effector) carries the radiation source 126, existing structure is used to insert the radiation source 126. In other words, in the first and second example embodiments of FIGS. 5 and 6, a dedicated arm is used separate from the substrate robot loading arm to carry the radiation source 126, but in the third embodiment of FIG. 7, the existing substrate robot loading arm 135 is configured to carry the radiation source 126 in addition to the substrate 102. Once step S208 has been completed such that the distance D is created, thereby providing the space 132, the controller 140 may instruct the substrate robot loading arm 135 to pick up the radiation source 126 via the hand 141 and to insert the radiation source 126 into the space 132. As shown in FIG. 7, the substrate robot loading arm 135 carrying the radiation source 126 may move from a position where the radiation source 126 is not in the space 132 to a position where the radiation source 126 is inserted into the space 132. The substrate robot loading arm 135 may translate and/or rotate along one or more of the x-, y-, z-axes; and three tilt axes as necessary via the first articulating arm 137 and the second articulating arm 139 to arrive at the inserted position. The substrate robot loading arm 135, the controller 140, and all components that allow the substrate robot loading arm 135 to pick up and position the radiation source 126 into the space 132 collectively form the second positioning system. That is, the second positioning system is the structure and control that allow positioning of the radiation source 126. In an alternative embodiment, the robot loading arm 135 is also used for loading the superstrate 108 on and off of the superstrate chuck 118 in addition to the radiation source. In an alternative embodiment, the robot loading arm 135 is used for: loading the superstrate 108 on and off of the superstrate chuck 118; carrying the radiation source 126; and is not used for loading the substrate. In an alternative embodiment, the robot loading arm 135 does not carry the radiation source 126 which is instead integrated into robot loading arm 135.

Figure 8A:
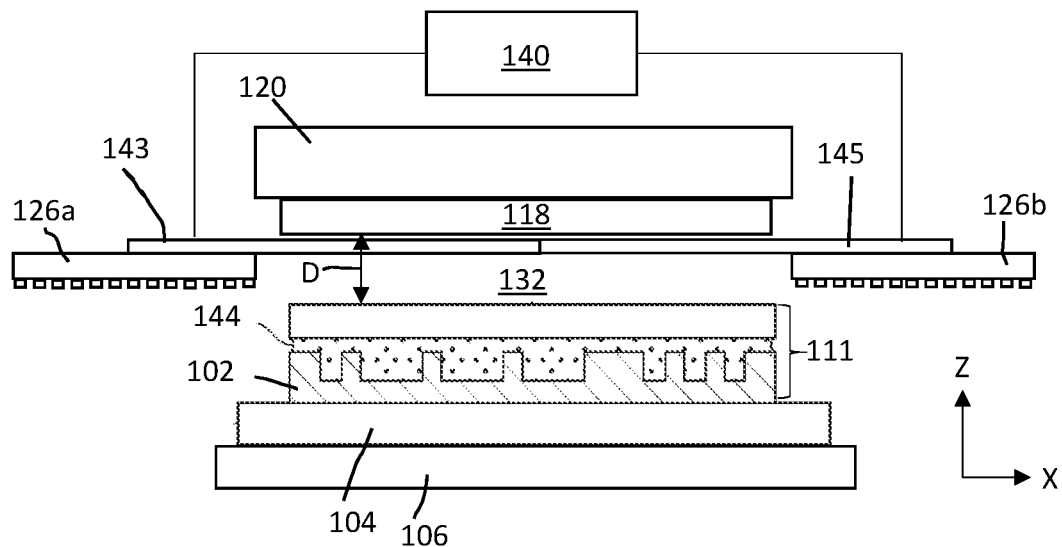
FIG. 8A is a schematic cross section of a fourth example embodiment for inserting a radiation source, where the radiation source is in a non-inserted position in accordance with an aspect of the present disclosure.
Figure 8B:
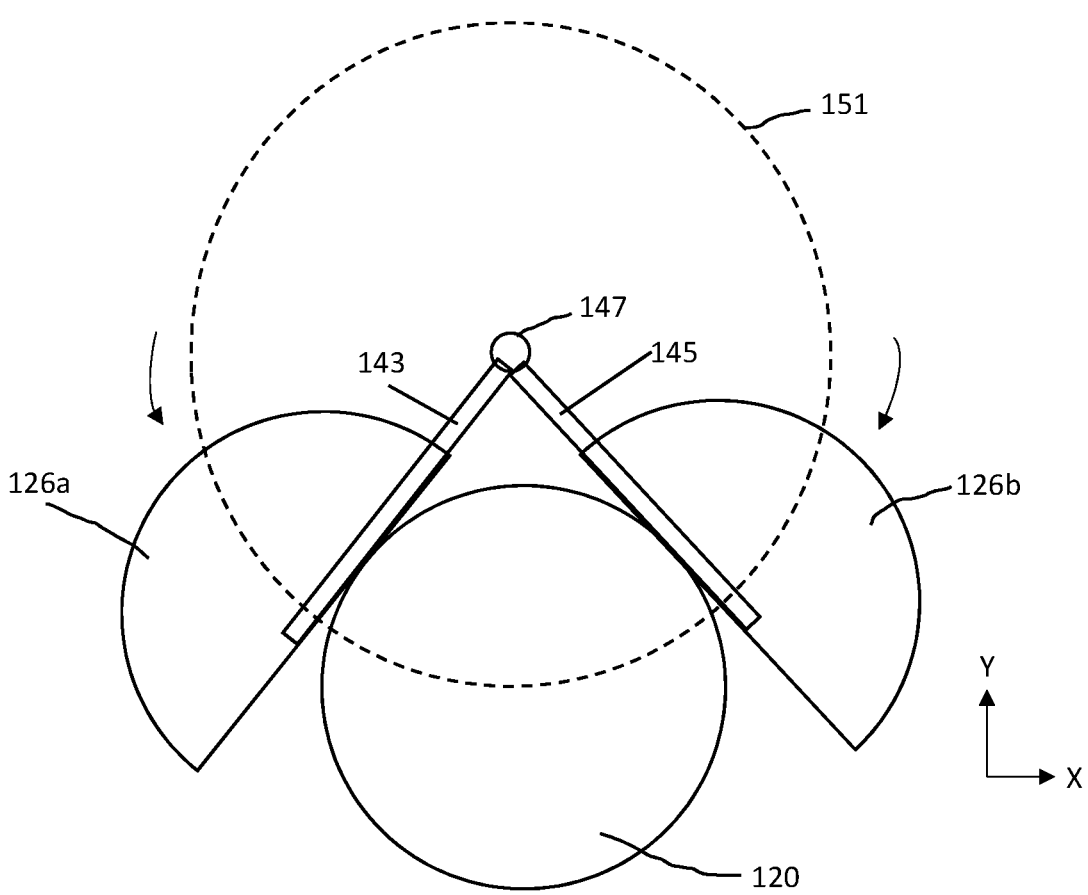
FIG. 8B is a schematic plan view of the fourth example embodiment for inserting the radiation source, where the radiation source is in the non-inserted position in accordance with an aspect of the present disclosure.
Figure 9A:
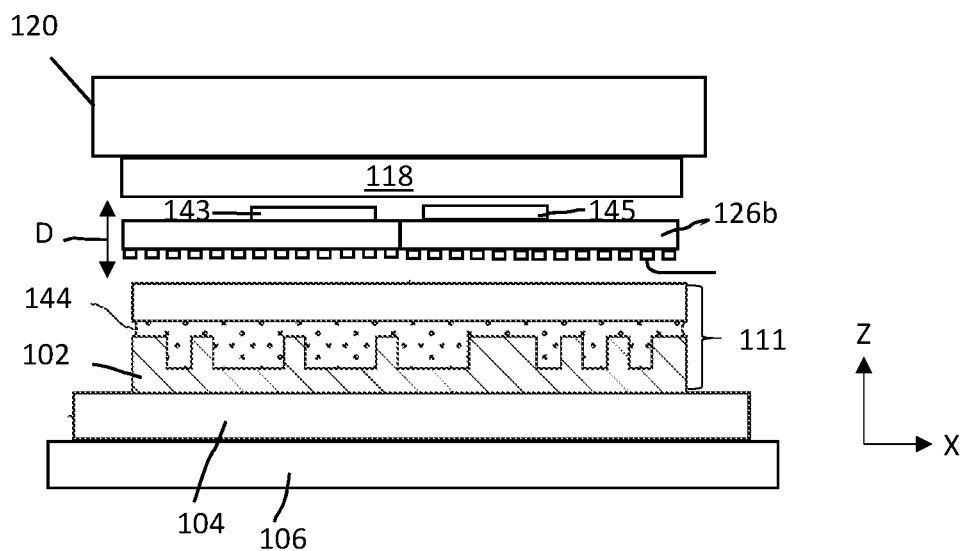
FIG. 9A is a schematic cross section of the fourth example embodiment for inserting a radiation source, where the radiation source is in an inserted position in accordance with an aspect of the present disclosure.
Figure 9B:
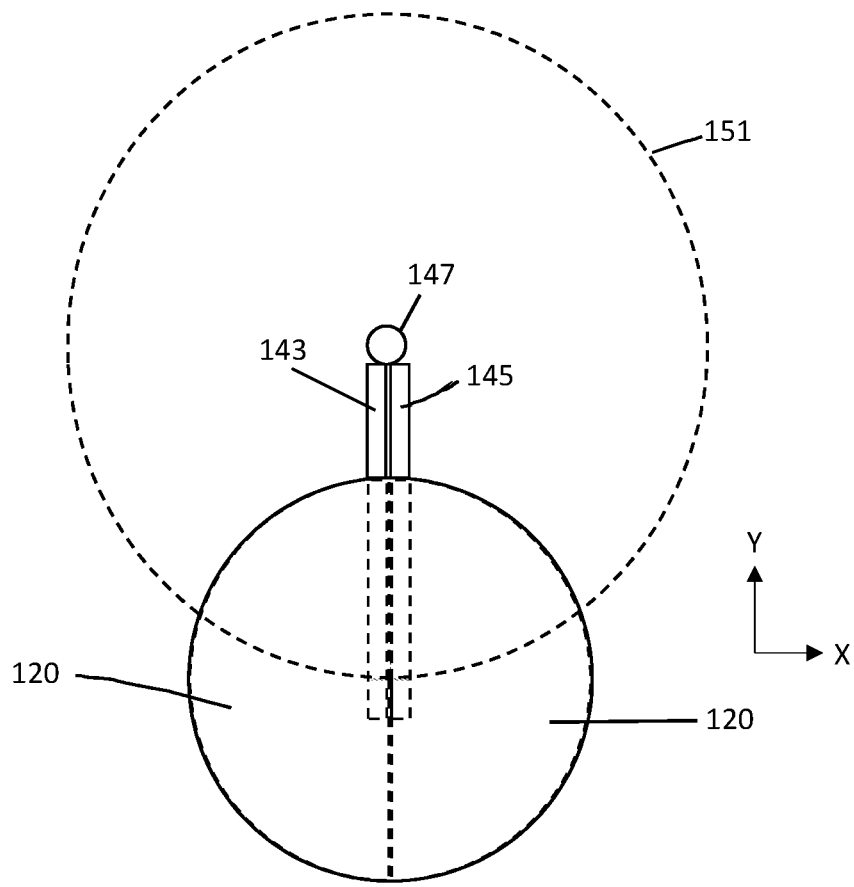
FIG. 9B is a schematic plan view of the fourth example embodiment for inserting the radiation source, where the radiation source is in the inserted position in accordance with an aspect of the present disclosure.

FIGS. 8A to 9B show a fourth example embodiment for inserting the radiation source 126 into the space 132. FIG. 8A a schematic cross section of the fourth example embodiment for inserting a radiation source 126, where the radiation source 126 is in a non-inserted position. FIG. 8B is a schematic plan view of the fourth example embodiment for inserting the radiation source, where the radiation source 126 is in the non-inserted position. FIG. 9A is a schematic cross section of the fourth example embodiment for inserting a radiation source 126, where the radiation source 126 is in an inserted position. FIG. 9B is a schematic plan view of the fourth example embodiment for inserting the radiation source 126, where the radiation source 126 is in the inserted position.

In the fourth example embodiment of FIGS. 8A to 9B, the radiation source 126 includes two separate components that, when positioned together, are the same as the radiation source in the other embodiments. More particularly, the radiation source 126 includes a first body 126a supporting a portion of the LEDs and a second body 126b supporting another portion of the LEDs. As best seen in FIG. 8B, the first body 126a and the second body 126b may each be in the shape of a semicircle and may be the same size. As best seen in FIG. 9B, when the straight edge of each of the first body 126a and second body 126b are brought to abut each other, they form a complete circle. This completed circle is the same size and shape as the unitary radiation source shown in FIG. 2. In an alternative embodiment, the radiation source 126 include more than two components which are subsections of the circle which brought together by one or more arms form a complete circle. For example, the number of components may be two to six.

The planarization system 100 of the embodiment of FIGS. 8A to 9B further includes a first pivoting arm 143 coupled with the first body 126a and a second pivoting arm 145 coupled with the second body 126b. The first pivoting arm 143 is coupled to the first body 126a at a first end of the first pivoting arm 143, while an opposite second end of the first pivoting arm 143 is coupled to a pivot point 147. Similarly, the second pivoting arm 145 is coupled to the second body 126b at a first end of the second pivoting arm 145, while an opposite second end of the first pivoting arm 145 is coupled to the pivot point 147. By rotating each of the first pivoting arm 143 and the second pivoting arm 145 about the pivot point 147, the first pivoting arm 143 is able to move the first body 126a along an arc path 151, while the second pivoting arm 145 is able to move the second body 126b along the arc path 151 (FIG. 8B). The first pivoting arm 143 and the second pivoting arm 145 may be rotated about the pivot point 147 via one or more motors. Preferably there is a separate motor for each pivoting arm.

As noted above, FIGS. 8A and 8B show the orientation of the fourth example embodiment where the first body 126a and the second body 126b of the radiation source 126 are outside of the space 132. FIGS. 9A and 9B show the orientation of the fourth example embodiment where the first body 126a and the second body 126b of the radiation source 126 are inserted into the space 132. As shown in FIGS. 8A and 8B, the insertion process starts with first body 126a and the second body 126b positioned at a location where the radiation 126 is not yet inserted into the space 132. Once step S208 has been completed such that the distance D is created, thereby providing the space 132, the controller 140 may instruct the first pivoting arm 143 and the second pivoting arm 145 to rotate about the pivot point 147 such that the first body 126a and the second body 126b travel along the arc path 151 toward each other. The first pivoting arm 143, the second pivoting arm 145, the motors, the controller 140, and all components that allow the first body 126a and the second body 126b to move along the arc path 151 form a second positioning system. That is, the second positioning system is the structure and control that allows positioning of the radiation source 126 into the space 132. The first pivoting arm 143 and the second pivoting arm 145 may be controlled by the controller 140 to continue to move the first body 126a and the second body 126b along arc path 151 toward each other until the first body 126a and the second body 126b (together forming the radiation source 126) are positioned completely within the space 132.

As noted above, FIGS. 9A and 9B show the orientation of the fourth example embodiment where the first body 126a and the second body 126b of the radiation source 126 are completely inside the space 132. As shown in FIG. 9A, in the cross-section view, each of the first body 126a and the second body 126b have been fully rotated about the arc path 151 until the flat edges are abutting each other. The first body 126a and the second body 126b together thus form a complete radiation source 126 that covers the entire surface area of the multilayer structure 111. As shown in FIG. 9B, in the plan view, the first body 126a and the second body 126b forming the radiation source 126 are located completely underneath the planarization head 120 once fully inserted into the space 312.

After the step S210 is completed and the radiation source 126 is inserted into the space 132, the method may then proceed to step S212, where the formed film layer 144 is cured, while maintaining the distance D between the multilayer structure 111 and the superstrate chuck 118. FIG. 4F shows a schematic cross section of the planarization system 100 at a moment when the curing process has begun, while the distance D is maintained. The polymerization process or curing of the formable material 124 may be initiated with actinic radiation (e.g., UV light radiation). For example, the radiation source 126 provides the actinic radiation causing formable material film 144 to cure, solidify, and/or cross-link, defining a cured layer 146 on the substrate 102. As noted above, radiation source 126 is directed such that the center of the light beam is directed downwardly, i.e., parallel to the Z direction. As shown in FIG. 4F, because the radiation source 126 is located between the superstrate chuck 118 and the multilayer structure 111, the UV light does not need to pass through the superstrate chuck 118. By avoiding passing the UV light through the superstrate chuck 118, the non-uniformity issue discussed above is avoided. Furthermore, because the UV light does not pass through the superstrate chuck 118, the superstrate chuck 118 may be made of a semi-transparent or opaque material relative to the UV Light.

As further shown in FIG. 4F, because the superstrate 108 is configured to be transparent with respect to the UV light radiation emitted from the array of LEDs 127 of the radiation source 126, the UV light radiation passes through the superstrate 108 and acts upon the formable material film 144 to cure the formable material film 144 resulting in the cured layer 146.

Figure 4G:
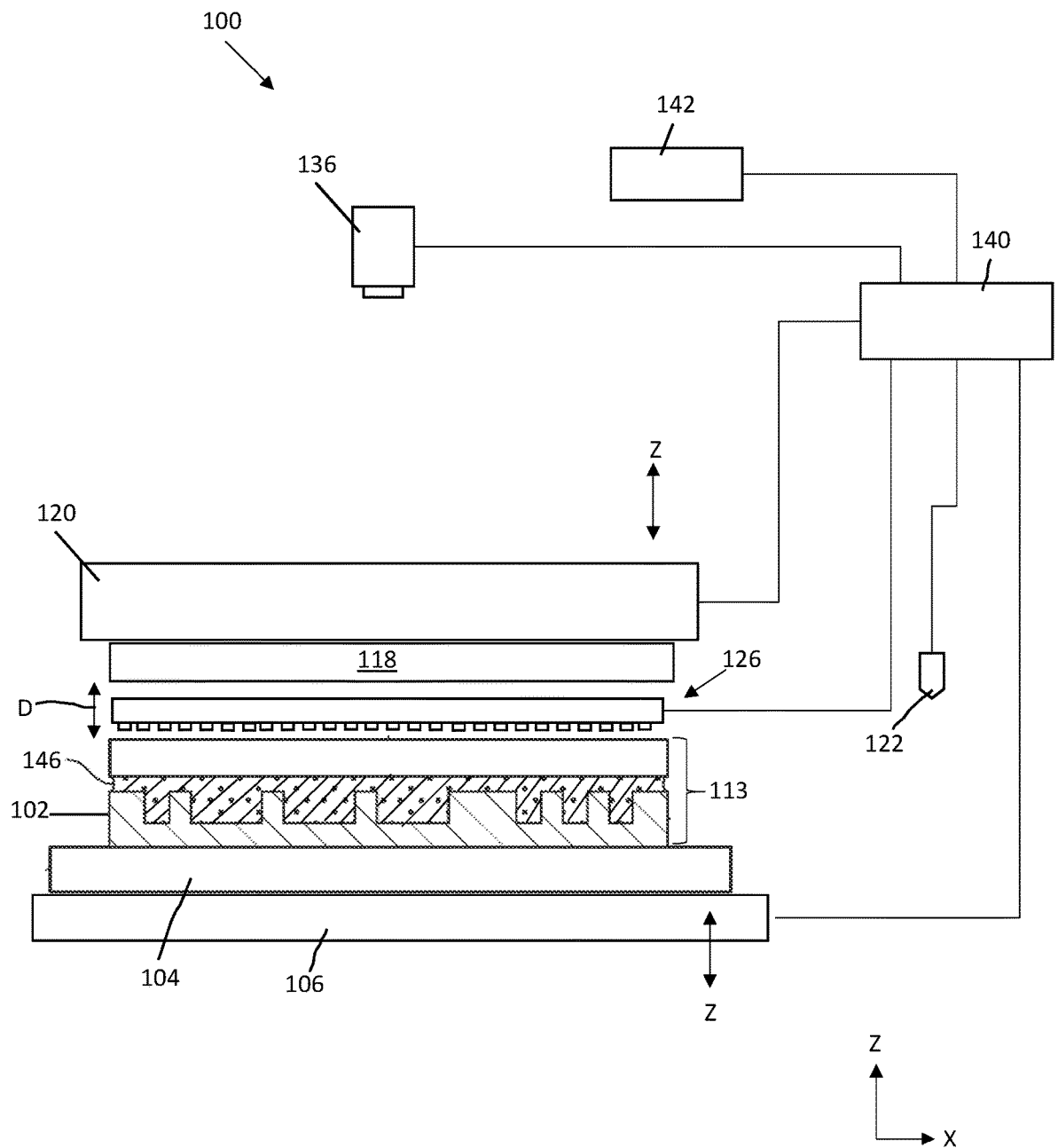

FIG. 4G shows a schematic cross section of planarization system 100 at a moment when the curing process in complete. As shown in FIG. 4G, when the curing process is complete, the formable material film 144 has become a cured layer 146. Likewise, the multilayer structure 111 has become a cured multilayer structure 113. The cured multilayer structure 113 is different from the multilayer structure 111 in that the multilayer structure 111 comprises the formable material film 144 between the superstrate 108 and the substrate 102, while the cured multilayer structure 113 comprises the cured layer 146 between the superstrate 108 and the substrate 102. In other words, the cured multilayer structure 113 comprises or consists of the superstrate 108, the cured layer 146, and the substrate 102, in that order. In another aspect, the cured multilayer structure 113 may also be considered to comprise or consist of the superstrate 108, the cured layer 146, the substrate 102, and the substrate chuck 104, in that order.

Figure 4H:
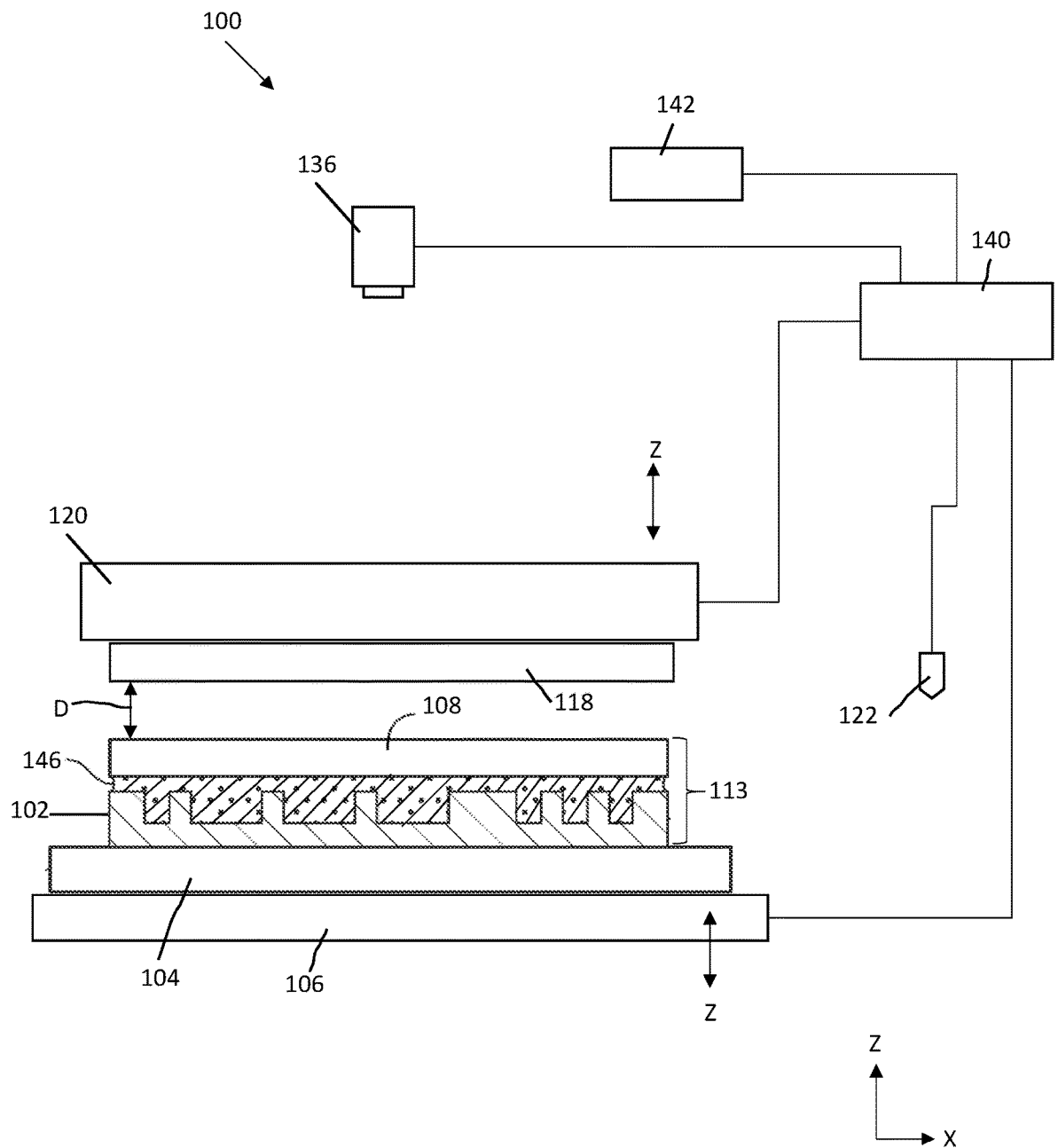

After the curing is complete in step S212, the method may proceed to step S214 where the radiation source 126 is removed from the space 132. FIG. 4H shows a schematic cross section of planarization system 100 at a moment when the radiation source 126 has been removed from the space 132, while the distance D is still present. Removing the radiation source 126 from the space 132 may be performed by reversing the insertion step S210. That is, the steps discussed above with respect to each of the embodiment illustrated in FIGS. 5 to 9B are reversed to remove the radiation source 126.

As shown in FIG. 5, the removal step for the first example embodiment entails using the second positioning system to move the arm 134 in a direction 160 opposite the direction 148. As shown in FIG. 6, the removal step for the second example embodiment entails using the second positioning system to rotate the arm 134 in a direction 162 opposite the direction 150. As shown in FIG. 7, the removal step for the third example embodiment entails using the second positioning system to move the substrate robot loading arm 135 via the first articulating arm 137 and the second articulating arm 139 out of the inserted position and return to the starting position. The removal step for the fourth example embodiment entails using the second positioning system to rotate the first pivoting arm 143 and the second pivoting arm 145 about the pivot point 147 opposite to the insertion rotation, such that the first body 126a travels along the arc path 151 opposite the direction of the insertion step, and such that the second body 126b travels along the arc path 151 opposite the direction of the insertion step (i.e., away from each other), until the first body 126a and the second body 126b return to the orientation shown in FIGS. 8A and 8B.

Figure 4I:
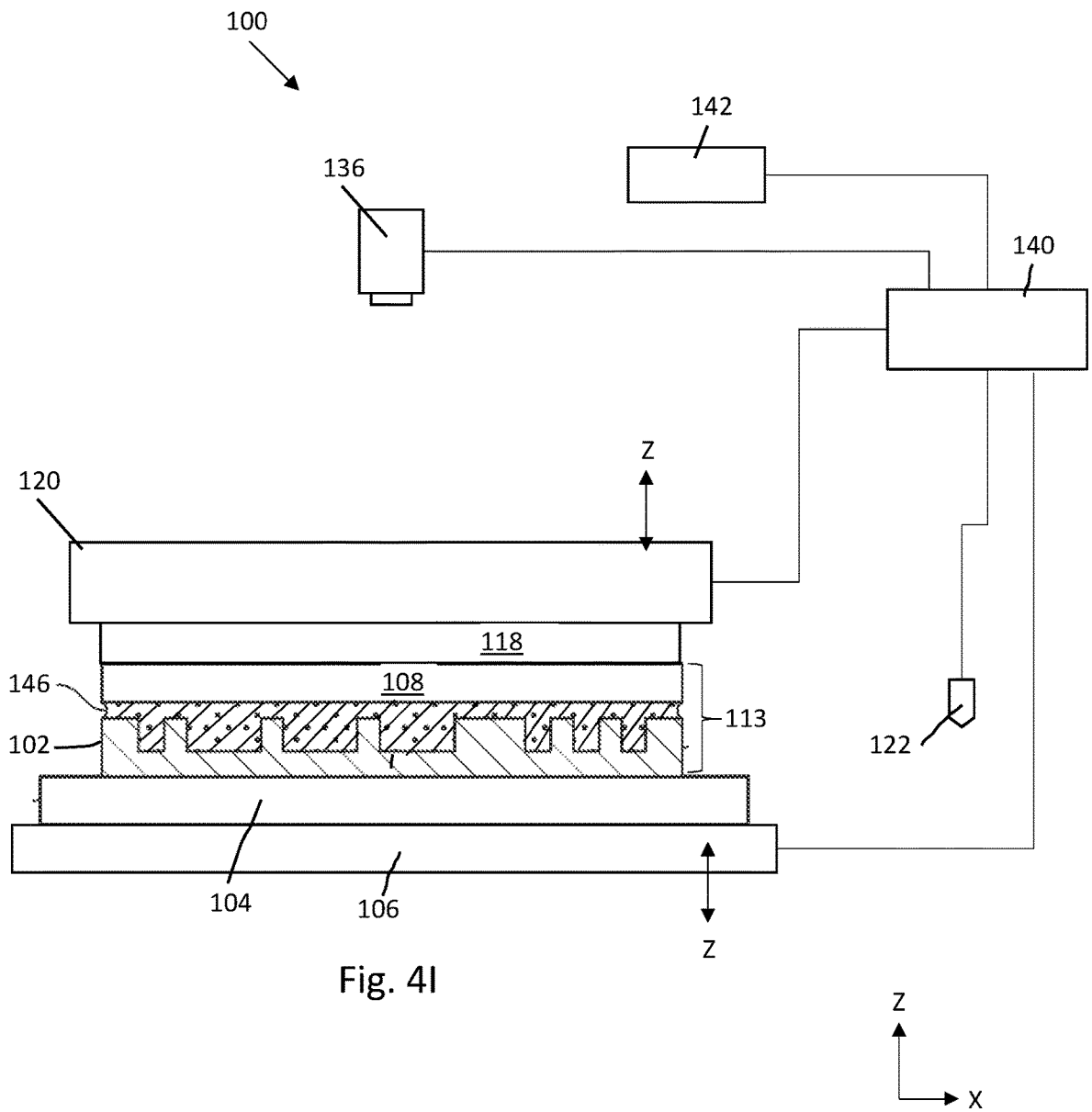

After the radiation source has been removed from the space 132, the planarization method 200 may then proceed to step S216, where the superstrate 108 is separated from the cured layer 146. To remove the superstrate 108 from the cured layer 146 the superstrate chuck 118 may be coupled once again to the superstrate 108 (i.e., rechucking the superstrate 108) via operation of the planarization head 120, while the superstrate 108 is still in contact with the cured layer 146. FIG. 4I shows a schematic cross section of planarization system 100 at a moment when the superstrate chuck 118 has been recoupled with the superstrate 108. In order to couple the superstrate chuck 118 with the superstrate 108, at least one of the planarization head 120 and the stage 106 is moved using the positioning system in the Z direction until the superstrate chuck 118 comes into contact with the superstrate 108. Preferably, only one of the planarization head 120 and stage 106 is moved in the Z direction using the positioning system, while the other is stationary. In a preferred embodiment planarization head 120 moves downwardly in the Z direction while the stage 106 remains stationary. However, in some instances both may be moved.

Once the superstrate 108 is coupled with the superstrate chuck 118 (FIG. 4I), the superstrate chuck 118 may begin to lift upwardly away from the substrate 102 by using the positioning system to move the planarization head 120 upwardly or using the positioning system to move the stage 106 downward in the Z direction. As noted above, both could also be moved. Because the superstrate 108 is coupled with superstrate chuck 118, the lifting force (or lowering force) will cause the superstrate 108 to separate from the cured layer 146.

Figure 4J:
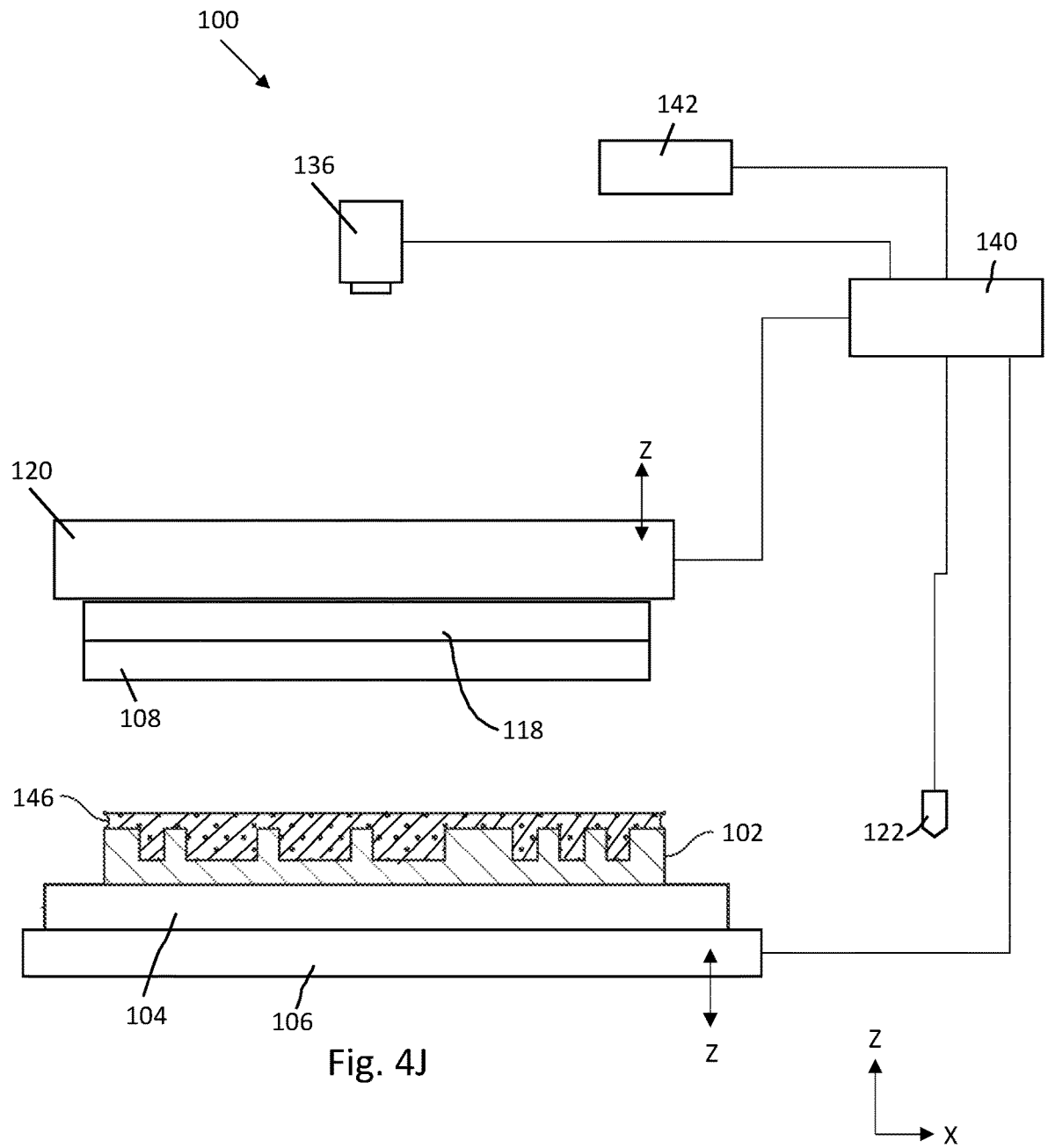

FIG. 4J shows a schematic cross section of planarization system 100 at a moment after the superstrate 108 has separated from the cured layer 146. As shown in FIG. 5J, at this moment, the superstrate 108 is once again in the starting position shown in FIG. 1, while the cured layer 146 is exposed on the substrate 102. The substrate 102 and the cured layer 146 may then be subjected to additional known steps and processes for device (article) fabrication, including, for example, patterning, curing, oxidation, layer formation, deposition, doping, planarization, etching, formable material removal, dicing, bonding, and packaging, and the like. The substrate 102 may be processed to produce a plurality of articles (devices). These additional steps may be performed by removing the substrate 102 having the exposed cured layer 146 from the housing 114 to a distinct location. Once the substrate 102, having the exposed cured layer 146, is removed, the planarization system 100 is ready to receive a new substrate with formable material and repeat the above process.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of planarizing a substrate comprising:
dispensing formable material onto a substrate;
contacting a superstrate held by a superstrate chuck with
   the formable material on the substrate, thereby forming a multilayer structure including the superstrate, a film of the formable material, and the substrate;

releasing the multilayer structure from the superstrate chuck;

providing a space between the superstrate chuck and the multilayer structure after the releasing;

positioning a light source into the provided space between the superstrate chuck and the multilayer structure; and curing the film of the multilayer structure by exposing the film to light emitted from the light source.

2. The method of claim 1, wherein providing the space comprises moving at least one of the superstrate chuck and the multilayer structure such that a distance is provided between the superstrate chuck and the multilayer structure.

3. The method of claim 2, wherein the distance is 30 mm to 150 mm.

4. The method of claim 2, wherein a ratio of the distance to a thickness of the light source is 1.4:1 to 1.6:1.

5. The method of claim 1, further comprising, after the curing, removing the light source from the provided space.

6. The method of claim 5, further comprising, after removing the light source, moving at least one of the superstrate chuck and the multilayer structure such that the superstrate chuck contacts the superstrate.

7. The method of claim 5, further comprising, after removing the light source, separating the superstrate from the cured film.

8. The method of claim 1, wherein the light source comprises an array of light emitting diodes.

9. The method of claim 8, wherein the light emitting diodes are configured to emit the light downwardly toward the multilayer structure.

10. The method of claim 8, wherein the light source comprises a unitary body for supporting the array of light emitting diodes.

11. The method of claim 1, wherein positioning the light source into the provided space comprises translating the light source into the space.

12. The method of claim 1, wherein positioning the light source into the provided space comprises rotating the light source into the space.

13. The method of claim 1, wherein the light source comprises a first body supporting a first array of light emitting diodes and a second body supporting a second array of light emitting diodes.

14. The method of claim 13, wherein positioning the light source into the provided space comprises translating or rotating each of the first body and the second body into the provided space.

15. The method of claim 1, further comprising:
picking up the light source with an end effecter,
wherein positioning the light source into the provided space comprises moving the light source with the end effecter.

16. The method of claim 15, further comprising positioning the substrate onto a substrate stage using the end effector prior to dispensing the formable material.

17. The method of claim 1, wherein the superstrate chuck is semitransparent or opaque to ultraviolet light.

18. The method of claim 1, wherein the superstrate chuck is transparent to ultraviolet light.

* * * * *